United States Patent [19]

Saxon

[11] 3,967,158
[45] June 29, 1976

[54] CIRCUIT FOR OPERATING A BAR GRAPH DISPLAY PANEL

[75] Inventor: Richard A. Saxon, Basking Ridge, N.J.

[73] Assignee: Burroughs Corporation, Detroit, Mich.

[22] Filed: Jan. 24, 1975

[21] Appl. No.: 543,882

[52] U.S. Cl............................ 315/169 TV; 313/514; 340/324 R
[51] Int. Cl.².......................................... H05B 37/00
[58] Field of Search.............. 313/514; 315/169 TV, 315/169 R; 340/324 M, 324 R

[56] References Cited
UNITED STATES PATENTS

| | | | |
|---|---|---|---|
| 3,328,790 | 6/1967 | Rhodes | 315/169 R X |
| 3,835,465 | 9/1974 | Tannas, Jr. et al. | 350/160 LC |
| R26,207 | 5/1967 | Sylvander | 315/169 R X |

*Primary Examiner*—R. V. Rolinec
*Assistant Examiner*—Lawrence J. Dahl
*Attorney, Agent, or Firm*—Robert A. Green; William B. Penn

[57] ABSTRACT

A bar graph display panel comprises a gas-filled envelope containing a series of fine, closely-spaced cathode lines connected in groups so that they can be energized sequentially and individually. The panel also includes an anode film supported on the face plate and aligned with and in operative relation with the series of cathode lines. The anode and cathodes are closely spaced and the panel contains an ionizable gas at relatively high pressure.

In order to use the display panel to display a bar of light, the anode and cathodes are connected in an operating circuit wherein each of the cathodes is energized or scanned and caused to glow sequentially. An analog signal to be displayed as a bar of light and a ramp signal are coupled to a comparator, the output of which energizes the anode electrode. When the two input signals are equal, the output of the comparator is zero, the anode is cut off, and the time in the scanning cycle when this occurs determines the number of cathodes which have been energized and the length of the bar of light displayed thereby. The scanning operation is carried out continually at such a rate that the bar of light appears to be stationary but is changeable in accordance with changes in the input analog signal.

1 Claim, 3 Drawing Figures

CIRCUIT FOR OPERATING A BAR GRAPH DISPLAY PANEL

BACKGROUND OF THE INVENTION

The principles of the invention are particularly useful for displaying analog signals, and, although devices are known in the prior art for providing a visual display of analog signals, none of these devices is as compact and as simple in construction and operation as the device of the invention. In addition, prior art devices and circuits for operating them do not provide a display of a continuous bar of light whose length is changeable.

DESCRIPTION OF THE PREFERRED EMBODIMENTS

A display panel 10 embodying the invention is of generally elongated rectangular shape and includes an insulating base plate 20 of glass, ceramic, or the like, and a face plate 30 of glass or the like and comprising a viewing window for the panel. The base plate and face plate are hermetically sealed together along a predetermined perimeter by means of a glass frit seal (not shown), as is well known in the art.

Figure 1:
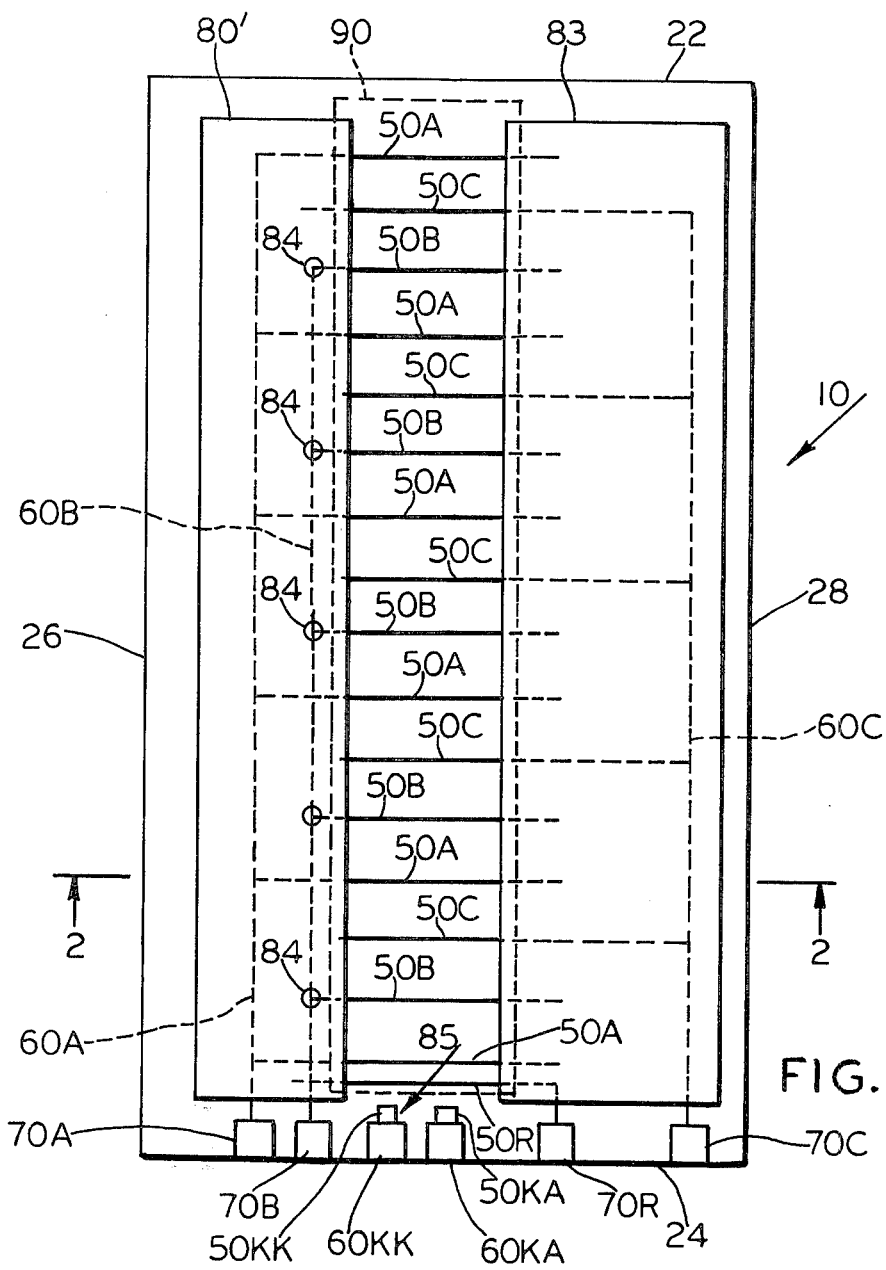
FIG. 1 is a plan view of a display panel embodying the invention.

The base plate 20 includes top and bottom edges 22 and 24, respectively, and left and right side edges 26 and 28, respectively, (FIG. 1). The base plate also includes a top surface, on which is formed a light-absorbing, opaque, preferably black, insulating layer 44 which is provided to optimize the viewing contrast of the panel. A series of short, closely spaced, parallel lines 50A, 50B, 50C of a conductive material are formed on the layer 44, preferably by a silk-screen process. The conductive lines are sufficiently close so that, when the lines are operated as cathodes, the glow of one cathode will appear to merge with the glow of an adjacent cathode. Typically, the cathode lines have a width of about 10 to 12 mils, and they are spaced apart about 5 to 8 mils.

In one arrangement, the conductive lines 50 are oriented perpendicular to the long axis of the base plate, and they are connected in groups, with the lines 50A, 50B, and 50C being in separate groups. Thus, each two A lines are separated by B and C lines, each two B lines are separated by A and C lines, and each two C lines are separated by A and B lines.

Figure 2:
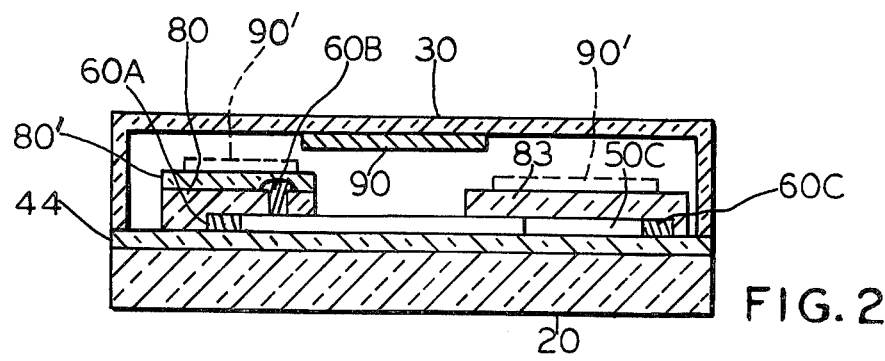
FIG. 2 is a sectional view along the lines 2—2 in FIG. 1.

All of the A lines are connected to a single common conductor 60A which extends parallel to the longitudinal axis of the base plate to the lower edge 24 where it terminates in a contact pad 70A. Similarly, lines 50C are connected to a longitudinal common conductor 60C which terminates in a terminal pad 70C at edge 24 of the base plate. An insulating layer 80 is formed over conductor 60A, with apertures 84 overlaying each of the lines 50B, and a single longitudinal conductor 60B is formed on the insulating layer 80 in contact with each line 60B and terminating in terminal pad 70B. Insulation 80' (FIG. 2) covers line 60B.

A similar insulating layer 83 is formed over the conductor 60C and portions of the conductive lines 50C. In addition, the layers 80 and 83 are spaced apart a suitable distance to provide a desired visible length of each of the conductive lines 50A, B, and C between them. The exposed lengths of these conductive lines, shown as solid black lines in FIG. 1, are the portions which glow in operation of the panel.

The panel includes an auxiliary "reset" cathode line 50R positioned parallel and adjacent to the first line 50A in the series. The conductive line 50R is connected to contact pad 70R, and it is turned on first before the adjacent line 50A in an operating cycle to provide excited particles which insure that the first line 50A itself will turn on when it is electrically energized. In addition, the panel includes a keep-alive cell 85 comprising a small-area anode 50KA and a small-area cathode 50KK disposed adjacent to the lower edge 24 of the base plate and connected to suitable terminal pads 60KK and 60KA. The keep-alive electrodes are positioned in close proximity to reset cathode 50R to provide excited particles therefor. Usually, the keep-alive electrodes are connected to a power source V and are always ON and generating excited particles.

The face plate of the panel includes, on its lower surface, a transparent conductive film anode 90 of NESA or the like which comprises a rectangular strip which extends from the upper edge to the lower edge of the panel and overlays the exposed cathode lines 50A, B, and C. The anode is also in operative relation with cathode 50R.

If desired, suitable masks are provided to shield the keep-alive cell 85 and reset cathode 50R from view. Such masks may be opaque films on the face plate, or they may be mechanical shields suitably disposed inside the panel.

In panel 10, the base plate and face plate are spaced apart a distance of the order of 20 to 25 mils, and the gas in the panel is provided at a pressure of the order of 400 Torr. One suitable gas mixture comprises 99.8% neon and 0.2% xenon. Another suitable gas filling is pure neon. With this arrangement of gas pressure and close spacing of base plate and face plate, as each cathode line 50 and the anode 90 are energized, cathode glow can be limited to the close vicinity of a single energized cathode even though the cathodes are connected in groups, and, a glow is transferred from cathode to cathode, no spurious glow develops at undesired locations. This is because the ionized particles, including metastable states, are limited in their ability to diffuse and are neutralized by the closely spaced base plate and face plate.

Figure 3:
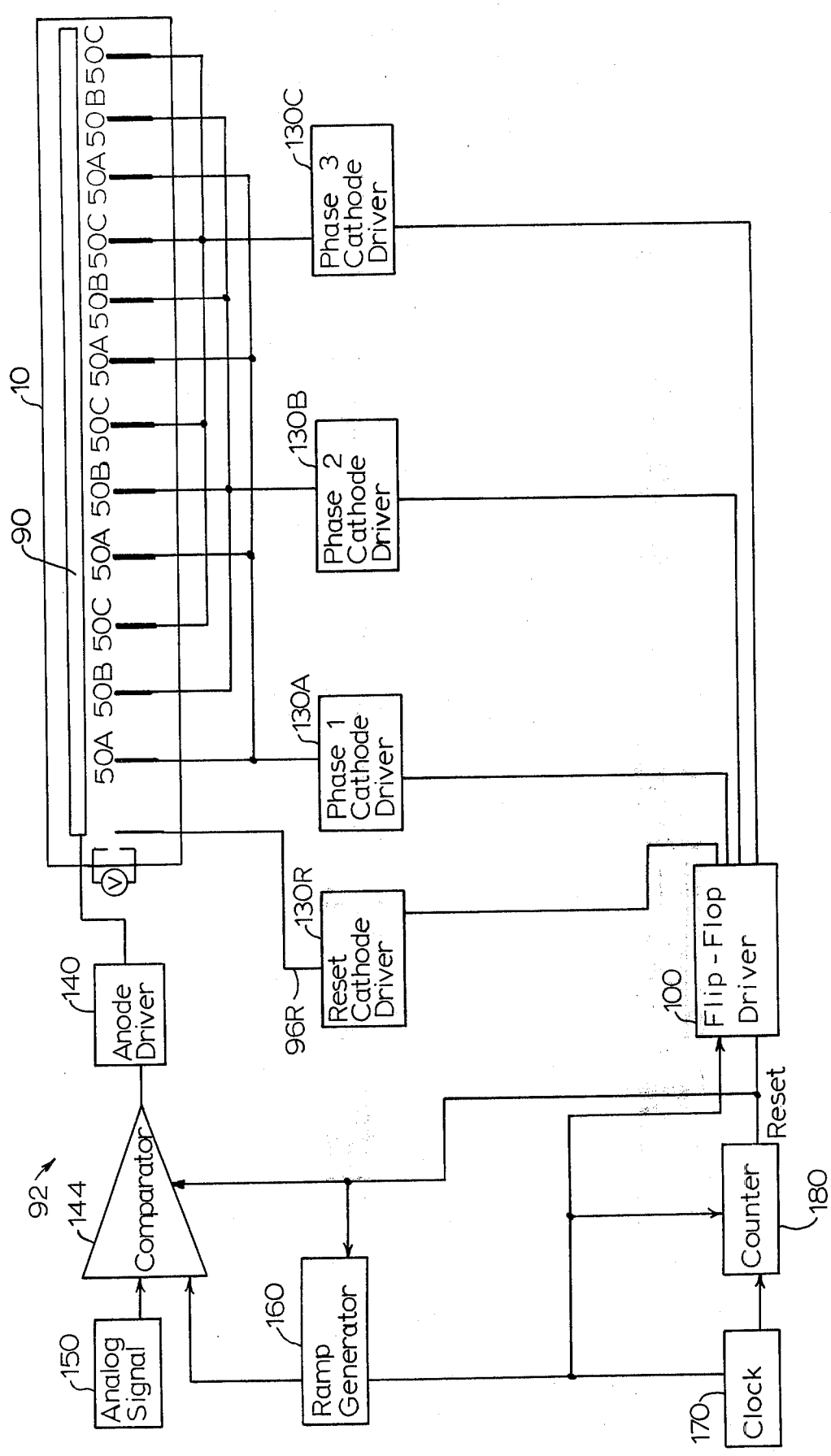
FIG. 3 is a schematic representation of the display panel of FIG. 1 and a drive circuit therefor embodying the invention.

One suitable circuit 92 for operating display panel 10 according to the invention is shown in FIG. 3, wherein panel 10 is shown schematically. In the circuit, power supplies, ground connections, current-limiting resistors, and such details are omitted since such elements can be readily provided by those skilled in the art. In addition, for more specific circuit details, reference is made to an article entitled "Plasma's Progress: Gas Discharge Technology Moves Into Analog Realm," which appeared in "Electronics" for March 1974.

In circuit 92, anode 90 is connected to a transistor driver 140, which itself is connected to the output of a comparator circuit or differential amplifier 144 having two inputs, one from a source 150 of an unknown analog input signal, to be represented by a bar of light in the panel 10, and one connected to a ramp voltage generator 160.

The electrodes 50KA and 50KK of the keep-alive cell 85 are connected to a suitable source of potential V, so that this cell is always ON and generating excited particles. The reset cathode 50R is connected by reset bus 96R to a transistor driver 130R, and each of the groups (or phases) of display cathodes 50 is connected by a bus 96 to a transistor driver 130, with phase 1 cathodes 50A being connected by bus 96A to driver 130A, phase 2 cathodes 50B being connected by bus 96B to driver 130B, and phase 3 cathodes 50C being connected by bus 96C to driver 130C. A flip-flop driver 100 is provided and connected to operate each of the drivers 130 in turn to achieve the desired scanning cycle described below. A clock 170 is connected to the ramp generator 160, to a flip-flop driver 100, and to a counter 180 which is adapted to generate a number of counts or pulses equal to the number of display cathode bars 50A, B, C in panel 10 and then to generate a reset pulse which is coupled to the flip-flop driver 100, to the ramp generator 160, and to the comparator 130.

In operation of panel 10, as thus connected, the keep-alive cell 85 provides a constant source of excited or ionized particles, and, at the beginning of a scanning cycle, reset cathode driver 130R is operated to apply operating potential to reset cathode 50R to cause it to glow and generate excited particles, and then operating potential is applied by the other cathode drivers 130 sequentially to each of the other cathodes 50 in turn, beginning with cathode 50A adjacent to the reset cathode 50R. Simultaneously, operating potential is applied to the anode 90 from the output of the differential amplifier 144. As long as there is an output from the differential amplifier and the anode carries positive potential, energization of the cathode lines 50 takes place from line to line and extends from the beginning of the series along the series until the analog signal and the ramp signal are equal in amplitude. At this time, there is no output from the differential amplifier, and the anode is de-energized; however, the clock and counter continue to run to the end of the series of cathodes to insure uniform cathode duty cycle each time a scanning cycle is carried out. During this time period, the cathodes glow up to a line in the cathode series determined by the magnitude of the analog signal and the length of time during which the anode is energized. Thus, a line or bar of glow is seen extending along a length of the cathode lines representative of the amplitude of the analog signal. This operation is repeated cyclically at such a rate that a stationary but changeable length or bar of light appears to glow in the panel.

In the scanning sequence described above, glow is transferred preferentially from the keep-alive cell, then to the reset cathode, then to the first display cathode 50A of the phase 1 cathodes, then to the first cathode 50B of the phase 2 cathodes, then to the first cathode 50C of the phase 3 cathodes, due to the generation of excited particles, first by the keepalive cell and then by each display cathode as it is turned on. Even though the display cathodes are connected in groups, only the cathode adjacent to an ON cathode will itself turn on, and not the more remote cathodes of the group because they are too remote from the supply of excited particles. In addition, as each display cathode turns on, the anode voltage drops (because of the current flow through the cell) to a level high enough to support ionization (sustaining potential) at the ON cathode, but too low to cause ionization at any other grounded cathode of the group.

What is claimed is:

1. A bar graph display system comprising
   a display panel comprising a gas-filled envelope including a base plate and a viewing face plate hermetically sealed together,
   a plurality of thin, parallel, linear cathodes disposed in a series along the surface of said base plate and positioned sufficiently close together so that, as the series of cathodes is energized and selected cathodes are caused to exhibit cathode glow, the glow of adjacent cathodes appears to blend to form a bar of light, said series of cathodes including a first cathode, a last cathode, and intermediate cathodes,
   a reset cathode positioned adjacent to and ahead of the first cathode in said series for use in starting a scanning cycle for said series of cathodes,
   an anode electrode disposed on said face plate overlying said series of cathodes,
   conductors connected to said cathodes and connecting said cathodes in groups with a single common conductor connected to each such group,
   a separate cathode driver connected to each common conductor for energizing each cathode in turn along said series of cathodes,
   a reset cathode driver connected to said reset cathode and adapted to be energized first before said separate cathode drivers in a cathode scanning cycle,
   an anode driver connected to said anode electrode for applying operating potential thereto, and
   a circuit coupled to said anode driver including a signal comparator circuit having a single output connected to said anode driver, said comparator circuit having two inputs, one input comprising a source of a sawtooth voltage, and the second input comprising a source of an analog signal to be represented in said panel by a bar of light made up of a group of energized cathodes, said cathode drivers continually energizing said cathodes in said series and causing said cathodes to exhibit cathode glow as long as there is an output from said comparator and said anode driver is energized thereby and energizes said anode.

\* \* \* \* \*